(12) United States Patent
Jochym et al.

(10) Patent No.: US 7,508,683 B1
(45) Date of Patent: Mar. 24, 2009

(54) INPUT/OUTPUT MODULE COMPUTER SERVER DOOR

(75) Inventors: Daniel A. Jochym, Dowingtown, PA (US); Joseph J. Scorsone, West Chester, PA (US)

(73) Assignee: Unisys Corporation, Blue Bell, PA (US)

( * ) Notice: Subject to any disclaimer, the term of this patent is extended or adjusted under 35 U.S.C. 154(b) by 307 days.

(21) Appl. No.: 11/198,488

(22) Filed: Aug. 5, 2005

(51) Int. Cl.
*H05K 9/00* (2006.01)

(52) U.S. Cl. .................................. 361/818; 361/816

(58) Field of Classification Search ............... 361/818, 361/816, 800, 756, 727, 741, 686, 802; 439/377; 174/35 R, 51
See application file for complete search history.

(56) References Cited

U.S. PATENT DOCUMENTS

| | | | |
|---|---|---|---|
| 5,559,672 A * | 9/1996 | Buras et al. ................. | 361/684 |
| 6,377,451 B1 * | 4/2002 | Furuya ....................... | 361/686 |
| 6,456,492 B1 * | 9/2002 | Wang et al. ................. | 361/686 |
| 6,563,714 B2 * | 5/2003 | Chang ........................ | 361/752 |
| 6,752,665 B2 * | 6/2004 | Kha et al. ................... | 439/668 |
| 7,081,587 B1 * | 7/2006 | Woolsey ..................... | 174/365 |
| 7,239,523 B1 * | 7/2007 | Collins et al. ............... | 361/752 |

* cited by examiner

*Primary Examiner*—Hung S Bui
(74) *Attorney, Agent, or Firm*—Richard J. Gregson; Robert P. Marley; RatnerPrestia (57) ABSTRACT

Methods and apparatus for providing electromagnetic interference (EMI) shielding for a module receiving area within a computer server housing configured to receive an input/output (IO) module are disclosed. The module receiving area is covered with a door. EMI shielding is provided by transitioning the door from a closed position to an open position in response to a force applied by the IO module, maintaining contact between the IO module and the door while the door is open to provide EMI shielding for the module receiving area when the IO module is present, and transitioning the door from the open position to the closed position in response to removal of the force applied by the IO module when the IO module is withdrawn from the module receiving area to provide EMI shielding for the module receiving area when the IO module is not present.

16 Claims, 7 Drawing Sheets

INPUT/OUTPUT MODULE COMPUTER SERVER DOOR

FIELD OF THE INVENTION

The present invention relates to the field of computer servers and, more particularly, to providing electromagnetic interference (EMI) shielding for computer servers.

BACKGROUND OF THE INVENTION

A computer server is a computer that allows other computers in a network to share resources and/or to communicate with one another. For example, computer servers may be used to share files, programs, or printers or to pass communications (e.g., e-mail) from one computer to another computer. Computer servers typically communicate with other computers and electronic devices such as printers through input/output (IO) cards. The IO cards are mounted within the housing of a computer server and provide a communication interface between the computer server and the other computers and electronic devices.

The computer server housing includes openings that provide the other computers or electronic devices with access to the IO cards mounted within the housing. When an IO card is mounted within a server, the IO card typically provides shielding to reduce EMI radiating from the portion of the opening occupied by the IO card. Portions of openings that are not presently occupied by IO cards are typically covered with a metal plate to reduce EMI radiating from those portions. The plate is typically held in place with one or more screws.

It is often necessary to insert or replace IO cards with new and/or different IO cards to provide improved and/or different services. When inserting an IO card for access through an opening that is not presently in use, the screw(s) in the plate covering that opening are unscrewed and the plate is removed prior to inserting the IO card. When removing an IO card that will not be replaced, a plate is inserted into the housing after removal of the IO card to cover the opening, and the plate is screwed into place to secure the plate to the computer server housing. Thus, the process of inserting and removing IO cards while providing EMI shielding is cumbersome.

Accordingly, improved methods and apparatus are needed for providing EMI shielding that are not subject to the above limitation. The present invention addresses this need among others.

SUMMARY OF THE INVENTION

The present invention is embodied in methods and apparatus for providing electromagnetic interference (EMI) shielding for a module receiving area within a computer server housing configured to receive an input/output (IO) module. The module receiving area is covered with a door. EMI shielding is provided by transitioning the door from a closed position to an open position in response to a force applied by the IO module, maintaining contact between the IO module and the door while the door is open to provide EMI shielding for the module receiving area when the IO module is present, and transitioning the door from the open position to the closed position in response to removal of the force applied by the IO module when the IO module is withdrawn from the module receiving area to provide EMI shielding for the module receiving area when the IO module is not present.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Preferred features of selected embodiments of this invention will now be described with reference to the figures. It is contemplated that any of the configurations and materials described hereafter can be modified within the scope of this invention.

Referring to the figures generally, in an exemplary embodiment of the present invention, a computer server 200 configured to receive one or more input/output (IO) modules 100 is provided. The computer server 200 includes a housing 202 having an opening 208 including a module receiving area 209 configured to receive an IO module 100. In addition, the computer server 200 includes a door 210 having an open position and a closed position, the door dimensioned to cover at least a portion of the module receiving area 209 when in the closed position. The computer server 200 further includes a closure mechanism 600 coupled to the door 210 and to the housing 202 that positions the door 210 relative to the module receiving area 209 and permits the door 210 to transition between the open position and the closed position. The closure mechanism 600 biases the door 210 toward the closed position. Additionally, the closure mechanism 600 enables the door 210 to transition from the closed position to the open position when the IO module 100 is inserted into the module receiving area 209 and to transition from the open position to the closed position when the IO module 100 is removed from the module receiving area 209.

In exemplary embodiments, the door 210 may include holes 612 for providing ventilation to the computer server housing 202. In addition, the door 210 and, optionally, the closure mechanism 600 may be at least partially conductive to create electrostatic discharge paths 618 from the front surface 212 of the door 210 to the computer server housing 202 to discharge electrostatic build-up in the IO module 100 into the computer server housing 202 via the door 210 when a leading edge 400 of the IO module 100 contacts the front surface 212 of the door 210 upon insertion into the computer server housing 202.

Figure 7:
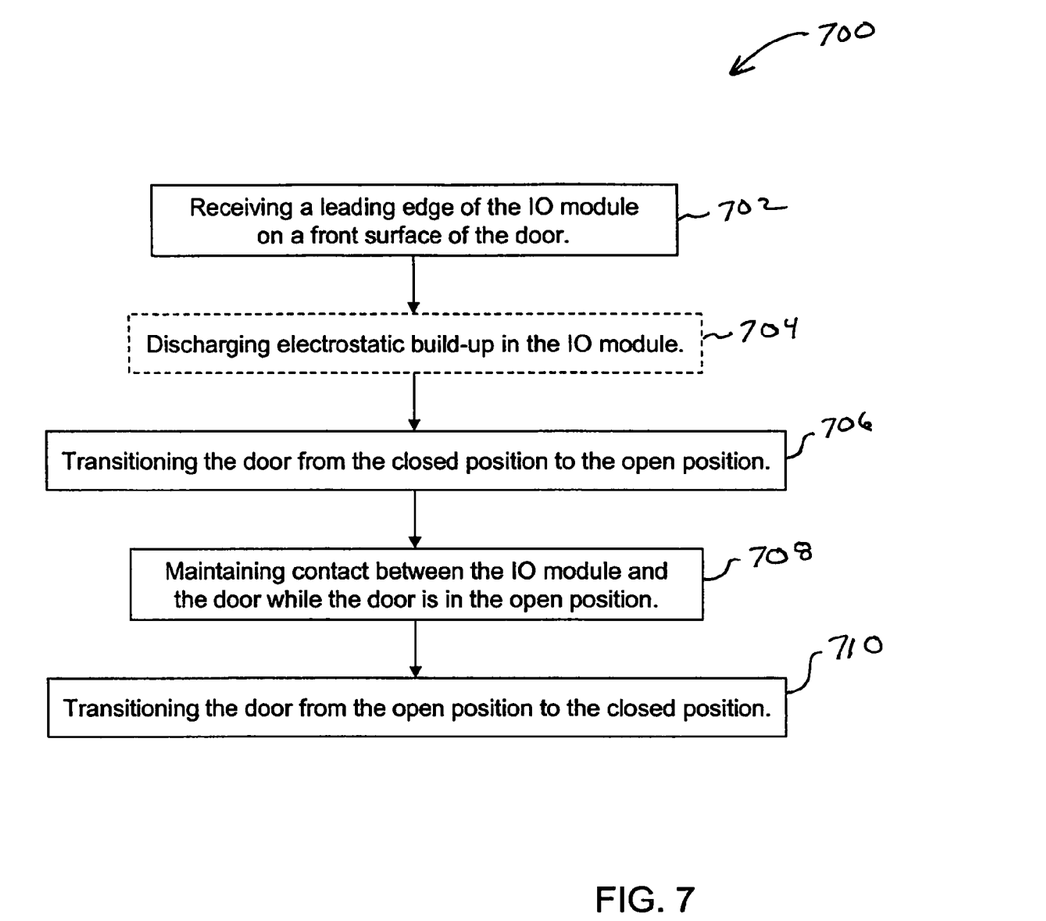
FIG. 7 is a flow chart of exemplary steps for providing EMI shielding for a module receiving area of a computer server housing in accordance with an aspect of the present invention.

In another exemplary embodiment of the present invention, a method of providing EMI shielding is provided. The method includes a step 706 of transitioning a door from a closed position to an open position in response to a force applied by a leading edge of an IO module along an insertion axis ($I_A$) that overcomes a bias of the door toward the closed position as the IO module is inserted into the computer server housing in the module receiving area. The method also includes a step 708 of maintaining contact between the IO module and the door while the door is in the open position thereby contributing to the EMI shielding for the module receiving area while the IO module is within the module receiving area. The method also includes a step 710 of transitioning the door from the open position to the closed position in response to removal of the force applied by the leading edge of the IO module along the insertion axis ($I_A$) as the IO module is withdrawn from the module receiving area thereby contributing to the EMI shielding for the module receiving area while the IO module is not within the module receiving area. In addition, the method may optionally include a step 702 of receiving a leading edge of the IO module on a front surface of the door and a step 704 of discharging electrostatic build-up in the IO module through the server computer housing via the door when the leading edge of the IO module is received on the front surface of the door.

Figure 1:
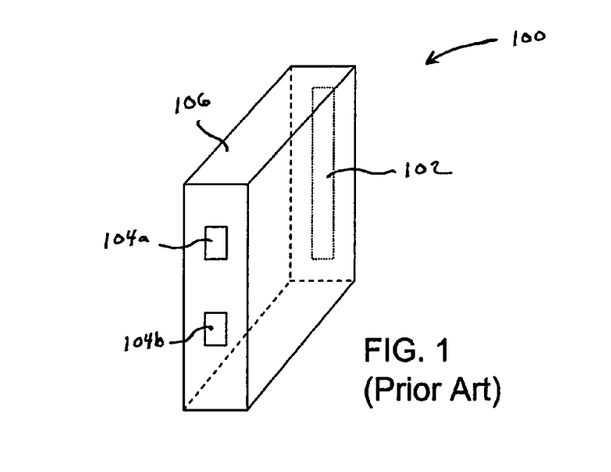
FIG. 1 is a perspective view of an exemplary prior art input/output (IO) module for use with the present invention.

The figures are now described individually. FIG. 1 depicts an exemplary input/output (IO) module 100 for use with a computer server. The IO module includes one or more server connectors (represented by server connector 102) and one or more user connectors (represented by two user connectors 104a and 104b). IO module electronics (not shown) pass data signals between the server connectors 102 and the user connectors 104. In an exemplary embodiment, the electronics are housed within a casing 106 and the server connectors 102 and user connectors 104 are supported by the casing 106. The casing 106 may be at least partially electrically conductive and the electronics within the housing may be coupled to the casing 106 to allow built-up static charge in the electronics to discharge through the casing 106. A suitable IO module 100 for use with the present invention is a Peripheral Component Interface Express (PCIe) ExpressModule in accordance with the PCIe ExpressModule specification developed by PCI-SIG®, a special interest group responsible for PCIe industry-standard I/O technology. Other suitable IO modules 100 for use with the present invention will be understood by one of skill in the art from the description herein.

Figure 2:
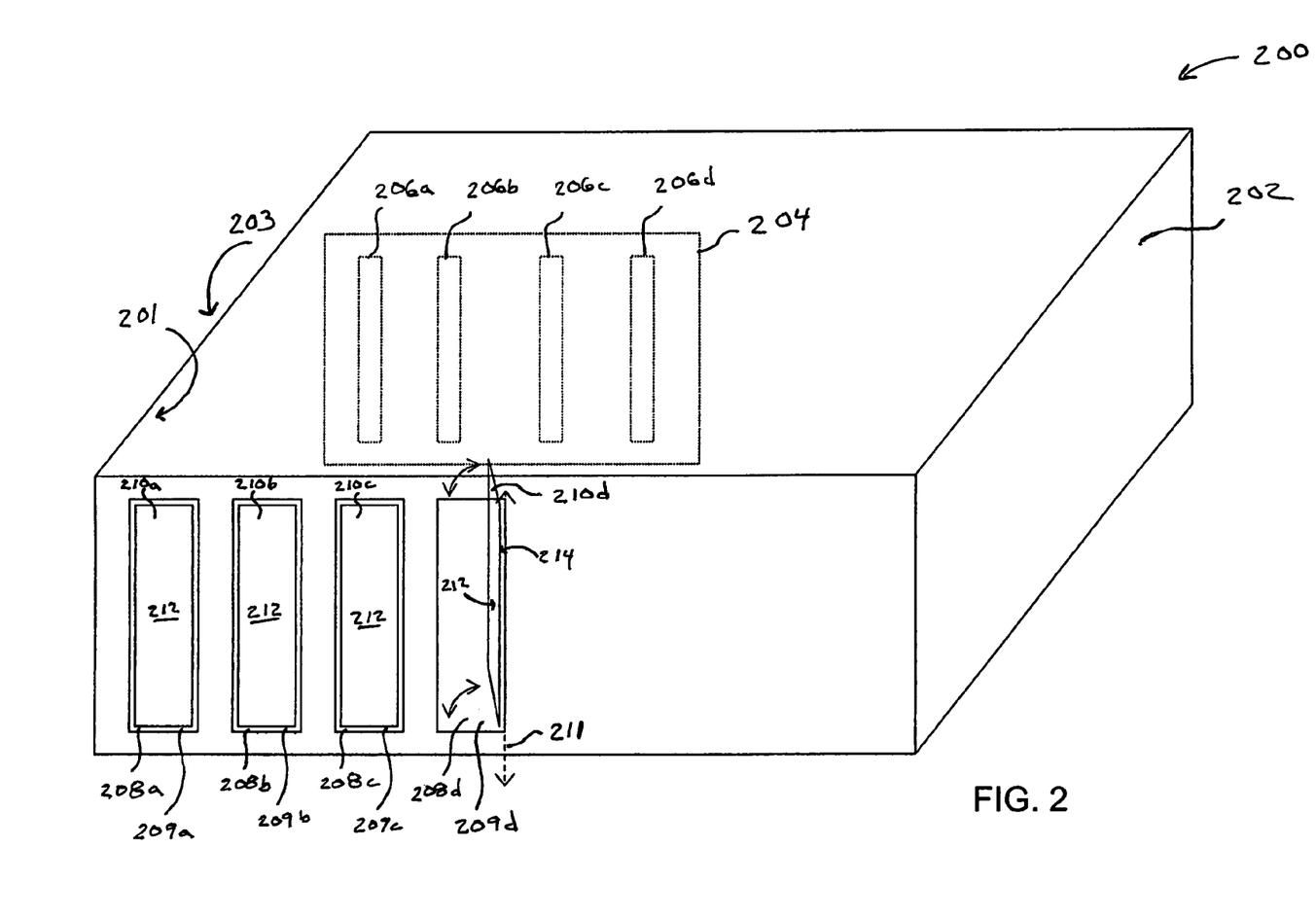
FIG. 2 is a perspective view of an exemplary computer server housing in accordance with an aspect of the present invention.

FIG. 2 depicts an exemplary computer server 200 for use in describing various aspects of the present invention. The computer server 200 includes a housing 202 having an interior surface 201 and an exterior surface 203. The computer server 200 further includes an input/output (IO) interface 204 within the housing 202. The IO interface 204 provides access to electronics (not shown) for the computer server 200. The IO interface 204 includes one or more mating connectors (represented by four mating connectors 206a-d) for establishing connections between the electronics of the computer server 200 and one or more IO modules 100 (FIG. 1).

The housing 202 includes one or more openings (represented by four openings 208a-d). In the illustrated housing 202, each opening 208 defines a module receiving area (represented by four module receiving areas 209a-d). Each module receiving area 209 (e.g., module receiving area 209a) represents an area through which an IO module 100 (FIG. 1) is inserted for connection with a mating connector 206 (e.g., mating connector 206a) on the IO interface 204. In an exemplary embodiment, the module receiving area 209 is sized to receive a PCIe IO module. In an alternative exemplary embodiment, the module receiving area 209 has a width between one and three inches and a length between four and six inches.

In an exemplary embodiment, each module receiving area 209 is at least partially covered by one or more doors (represented by doors 210a-d). The doors 210 are coupled to the housing via one or more closure mechanisms, which are described in further detail below. Each door 210 has a front surface 212 and a back surface 214. In addition, each door 210 has an open position and a closed position. In FIG. 2, three of the doors are illustrated in their closed position (i.e., doors 210a-c) and one of the doors is illustrated in its open position (i.e., door 210d). In the closed position, at least a portion of the module receiving area 209 (e.g., module receiving area 209a) through which an IO module 100 is inserted for connection to a corresponding mating connector 206 (e.g., mating connector 206a) is covered by a door 210 (e.g., door 210a). In the open position, a door 210 (e.g., door 210d) is reoriented to provide room for the IO module 100 to pass through the module receiving area 209 (e.g., module receiving area 209d) for connection to a corresponding mating connector 206 (e.g., mating connector 206d). The doors may be hinged on one side and rotate about a rotation axis 211 adjacent the rotation side between the closed position and the open position. In an exemplary embodiment, the doors 210 are biased in their closed position. Additional details regarding the doors 210 are described below.

Figure 3:
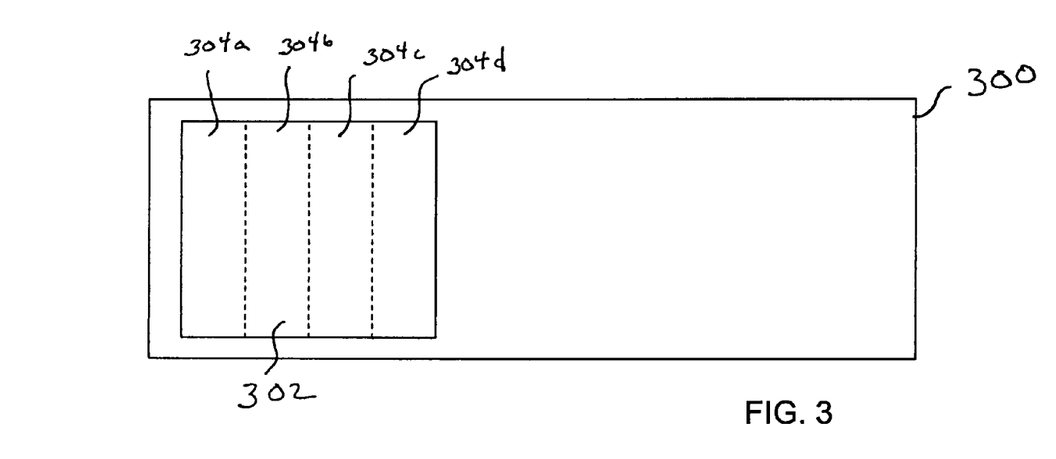
FIG. 3 is a front view of an alternative exemplary computer server housing in accordance with an aspect of the present invention.

FIG. 3 depicts an alternative exemplary computer server housing 300. The illustrated housing 300 includes an opening 302 sized to accommodate multiple module receiving areas (represented by four module receiving areas 304a-d separated by dashed lines for illustrative purposes) for receiving multiple IO modules 100 (FIG. 1). The opening 302 may include channels (not shown) corresponding to each module receiving area 302 to guide individual IO modules 100 for each module receiving area 302 to a corresponding mating connector 206 (FIG. 2). The opening 300 is illustrated without doors to facilitate description.

Figure 4:
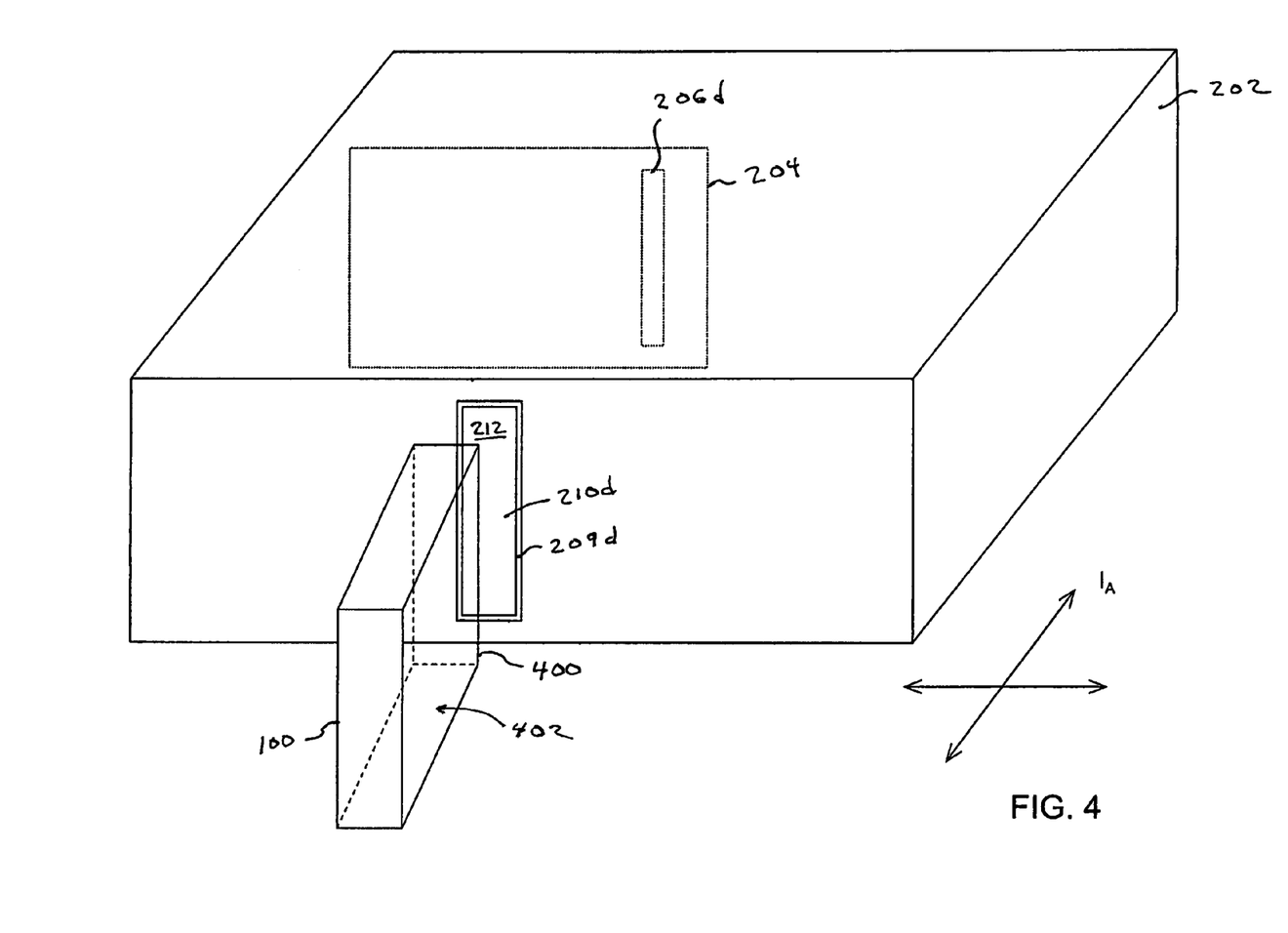
FIG. 4 is a perspective view of an IO module and an exemplary computer server housing for receiving the IO module in accordance with an aspect of the present invention.

FIG. 4 depicts an IO module 100 prior to insertion into a module receiving area 209d of a computer server housing 202 for connection with a mating connector 206d of an IO interface 204 within the housing 202. The module receiving area 209d includes a door 210d (illustrated in its closed position) covering the module receiving area 209d.

The IO module 100 includes a leading edge 400 that contacts the front surface 212 of the door 210d as the IO module 100 is inserted into the computer server housing 202 along an insertion axis ($I_A$). In an exemplary embodiment, the leading edge 400 is at least partially metallic and is electrically connected to electronics within the IO module 100. This allows built-up electrostatic charge in the electronics within the IO module 100 to be discharged through the leading edge 400 of the IO module 100 to the housing 202 via the door 210d as the IO module 100 is initially inserted into the housing 202. The IO module 100 further includes side surfaces (represented by side surface 402) that may contact the door 210d as the IO module 100 is inserted farther into the module receiving area 209d.

Figure 5:
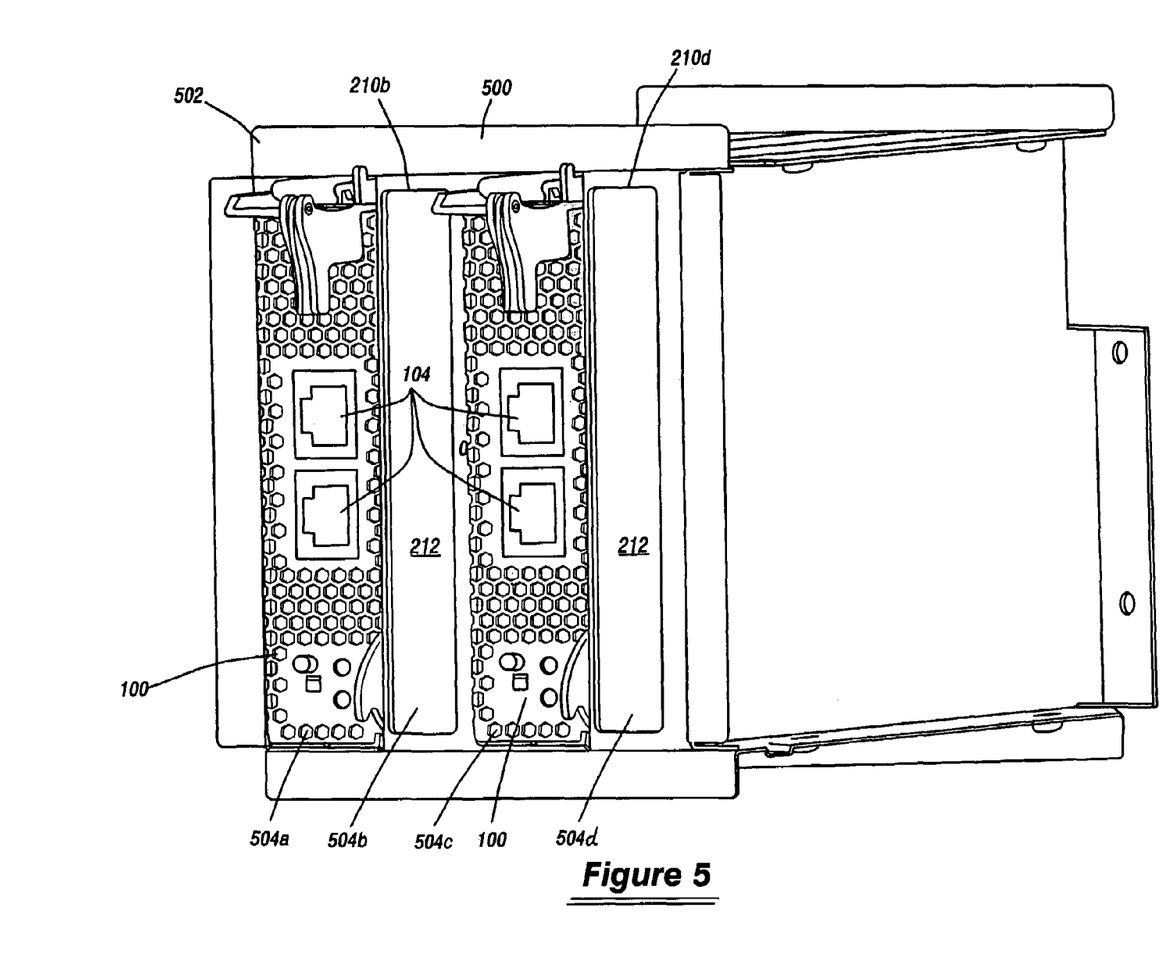
FIG. 5 is a perspective view of an IO module receiving sub-unit for use within an opening of a computer server housing in accordance with an aspect of the present invention.

FIG. 5 depicts a four module sub-unit 500 for receiving IO modules 100. The four module sub-unit 500 includes an enclosure 502 that forms part of the housing 300 (FIG. 3) when the enclosure 500 is mounted within an opening 302 (FIG. 3) in the housing 300. The enclosure 502 defines four module receiving areas 504a-d. The enclosure 502 is illustrated with two IO modules 100 in two of the module receiving areas 504 (i.e., module receiving areas 504a and 504c) with the doors 210 associated with these module receiving areas 504 positioned in their open position to allow the IO modules 100 to pass into the enclosure 502 (housing 202/300 of FIGS. 1 and 3). In the illustrated embodiment, when the doors 210 are in their open position, they are hidden from view. The remaining two module receiving areas 504 (i.e., module receiving areas 504b and 504d) are illustrated without an IO module 100. The doors 210 for these module receiving areas 504 (i.e., doors 210b and 210d) are illustrated in their closed position.

Figure 6A:
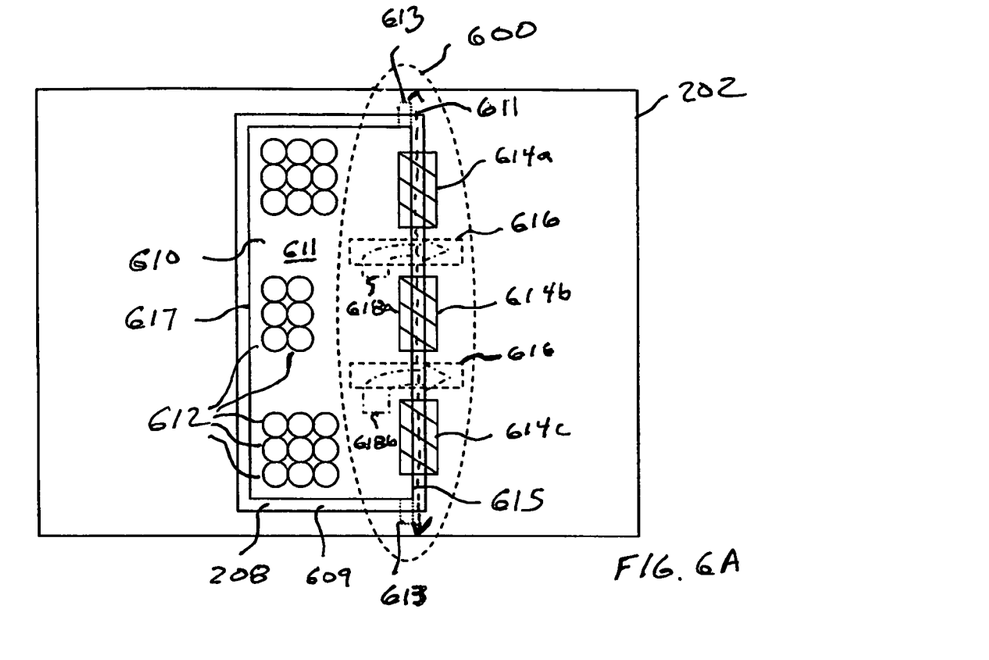
FIG. 6A is a perspective view of an exemplary door and closure mechanism mounted within a module receiving area of a computer server housing in accordance with an aspect of the present invention.

FIG. 6A depicts an exemplary door 610 positioned within an opening 208 of a housing 202 where the opening 208 includes a single module receiving area 609. The illustrated door 610 is dimensioned to cover at least a portion of the module receiving area 609. The illustrated door 610 includes holes 612 that extend through the door 610 from the front surface 611 to the back surface to provide ventilation for the housing 202 when the door 610 is in the closed position. In an exemplary embodiment, the holes 612 are sized in a known manner to provide ventilation while inhibiting the emission of EMI. In an exemplary embodiment, the door is at least partially conductive.

A closure mechanism 600 is coupled to the door 610 and to the housing 202 (or enclosure 502 if a sub-unit is used as illustrated in FIG. 5) to position the door 610 relative to the module receiving area 609 and to permit the door 610 to transition between its open position and its closed position. The closure mechanism 600 enables the door to transition from the closed position to the open position when an IO module 100 (FIG. 1) is inserted into the module receiving area 609 and to transition from the open position to the closed position when the IO module 100 is removed from the module receiving area 609.

The closure mechanism 600 includes transition apparatus that enables the door to transition between the closed position and the open position. In an exemplary embodiment, the transition apparatus includes one or more hinges (represented by three hinges 614a-c). The hinges 614 couple one side of the door (i.e., the rotation side 615) to the housing 202 and the opposite side of the door (i.e., the free side 617) rotates about a rotation axis 611 adjacent the rotation side 615. In an alternative exemplary embodiment, one or more of the hinges 614 may be replaced with projections (represented by two projections 613) that mate with indentations (not shown) in the housing 202 and the door 610 rotates about the projections to transition between the closed position and the open position. Other suitable transition apparatus will be understood by one of skill in the art from the description herein.

The closure mechanism 600 further includes a resilient member that biases the door in its closed position. In an exemplary embodiment, the resilient member is a spring incorporated into the hinges (which is represented with cross hatching in the illustrated embodiment). In an alternative exemplary embodiment, a strip of resilient material 616 is attached to the back surface of the door 610 and to the interior surface of the housing 202. The strip of resilient material 616 may be conductive. Other suitable resilient members will be understood by one of skill in the art from the description herein.

In an exemplary embodiment, at least a portion of the door 610, e.g., the front surface 611 of the door 610 on the rotation side 615 and/or the free side 617, abuts a side surface 402 of the IO module 100 when the IO module 100 is within the module receiving area 609 and the door 610 is in the open position to provide EMI shielding for the housing 202 in the module receiving area 609. When the portion of the front surface 611 of the door 610 abuts the side surface 402 of the IO module 100, i.e., when the door 610 is in its open position, EMI leakage is inhibited at the interface between the door 610 and the side of the IO module 100 in contact with the door 610.

In an exemplary embodiment, the door 610 and the transition apparatus and/or the resilient member are at least partially conductive. This results in the creation of one or more electrostatic discharge paths (represented by two electrostatic discharge paths 618a and 618b). The electrostatic discharge paths 618 provide a path for electrostatic discharge built-up in an IO module 100 (FIG. 1) to pass to the housing 202 when a leading edge 400 (FIG. 4) of the IO module 100 contacts the front surface 611 of the door 610.

Figure 6B:
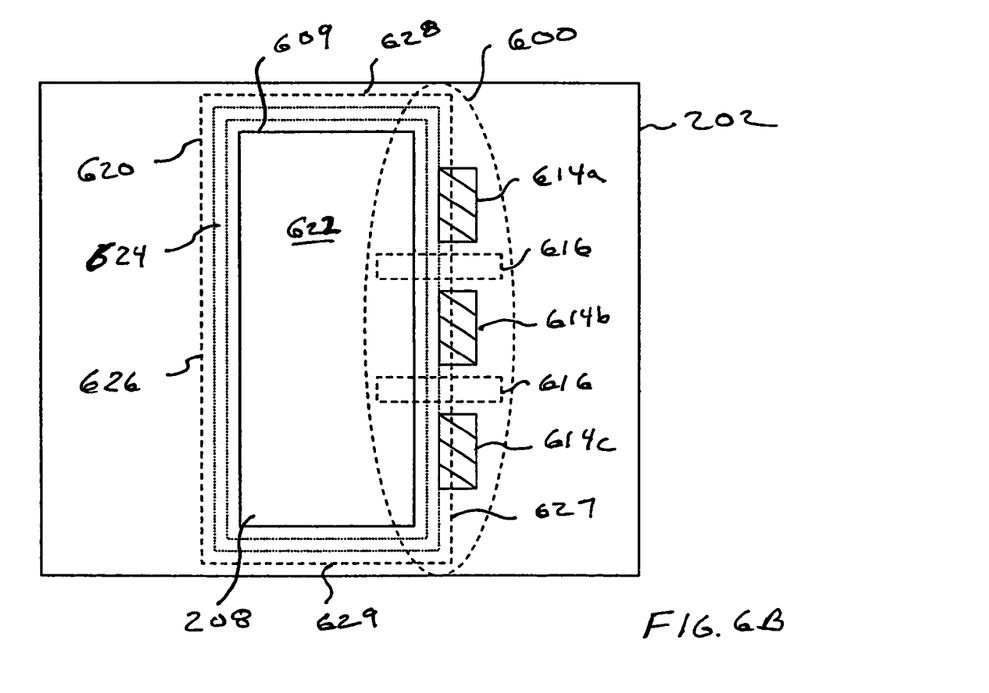
FIG. 6B is a perspective view of an alternative exemplary door and closure mechanism mounted within a module receiving area of a computer server housing in accordance with an aspect of the present invention.

FIG. 6B depicts an alternative exemplary door 620 positioned within an opening 208 of a housing 202 where the opening 208 includes a single module receiving area 609. The illustrated door 620 is dimensioned such that it is larger than the module receiving area 609. A closure mechanism (e.g., hinges 614 and resilient material strips 616) positions the door 620 with respect to the housing 202 such that at least a portion of the front surface 622 of the door 620 is adjacent the interior surface of the housing 202 when the door 620 is in the closed position.

The front surface 622 of the door 620 includes a lip 624 extending at least partially around the perimeter of the door 620. In the illustrated embodiment, the lip 624 extends around the entire perimeter of the front surface 622 of the door 620. In an alternative exemplary embodiment, the lip 624 extends only partially around the front surface 622 of the door 620, e.g., adjacent a free side 626 of the door 620, adjacent a rotation side 627 of the door 620 and/or adjacent a top side 628 and a bottom side 629 of the door 620. The interior surface of the housing 202 that receives the lip 624 of the door 626 when the door 626 is in the closed position may be substantially flat. Alternatively, the interior surface of the housing 202 may have a structure (not shown) that mates with lip 624 to improve the contact between the door 620 and the housing 202. For example, the lip 624 may be a ridge extending around the door 620 and the mating structure on the interior surface of the housing 202 may be a channel (not shown) sized to receive the ridge. Various alternative lips and/or mating structures will be understood by one of skill in the art from the description herein.

The lip 624 provides improved EMI shielding for the housing 202 in the module receiving area 609 when the door 620 is in the closed position by abutting the interior surface of the housing 202. In addition, the lip 624 may provide improved EMI shielding when the door 620 is in the open position by abutting a side surface 402 of the module 100 (FIG. 1) when the IO module 100 is positioned within the module receiving area 609. When the lip 624 of the door 620 abuts the interior surface of the housing 202, i.e., when the door 620 is in its closed position, EMI leakage is inhibited at the interface between the door 620 and the housing 202. When the lip 624 of the door abuts the side surface 402 of the IO module 100, i.e., when the door 620 is in its open position, EMI leakage is inhibited at the interface between the door 620 and the side of the IO module 100 in contact with the door 620.

Figure 6C:
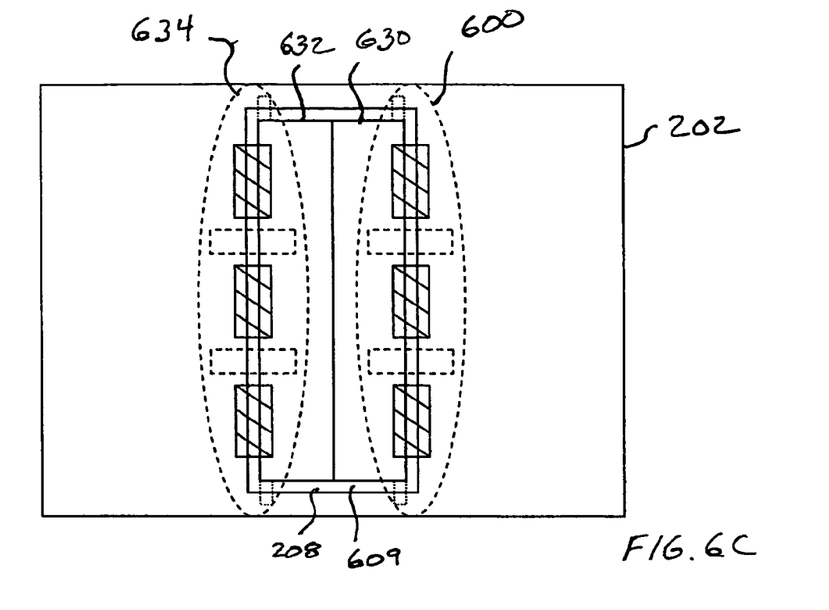
FIG. 6C is a perspective view of an alternative exemplary door and closure mechanism mounted within a module receiving area of a computer server housing in accordance with an aspect of the present invention.

FIG. 6C depicts an exemplary door 630 positioned within an opening 208 of a housing 202 where the opening 208 includes a single module receiving area 609. The illustrated door 630 is dimensioned to cover at least a portion of the module receiving area 609, i.e., approximately half of the module receiving area 609. In addition, FIG. 6 depicts an other exemplary door 632 positioned within the opening 208 of the housing 202. The illustrated other door 632 is dimensioned to cover at least a portion of the module receiving area 609 not covered by the door 630, i.e., approximately half of remaining portion of the module receiving area 609.

A closure mechanism 600 is coupled to the door 630 and to the housing 202 (or enclosure 502 if a sub-unit is used as illustrated in FIG. 5) to position the door 630 relative to the module receiving area 609 and to permit the door 630 to transition between its open position and its closed position. In addition, an other closure mechanism 634 is coupled to the other door 632 and to the housing 202 (or enclosure 502 if a sub-unit is used as illustrated in FIG. 5) to position the door 632 relative to the module receiving area 609 and to permit the other door 632 to transition between its open position and its closed position. The other closure mechanism 634 may be similar to the closure mechanism 600. The doors 630/632 (which may each include a lip 624 (FIG. 6B)) provide EMI shielding when the doors 630/632 are in the open position by abutting opposing side surfaces of the IO module 100 (FIG. 1) when the IO module 100 is positioned within the module receiving area 609. When the doors 630/632 (or lips 624 associated with the doors 630/632) abut the side surfaces of the IO module, EMI leakage is inhibited at the interface between each door 630/632 and the side of the IO module 100 in contact with that door 630/632.

Figure 6D:
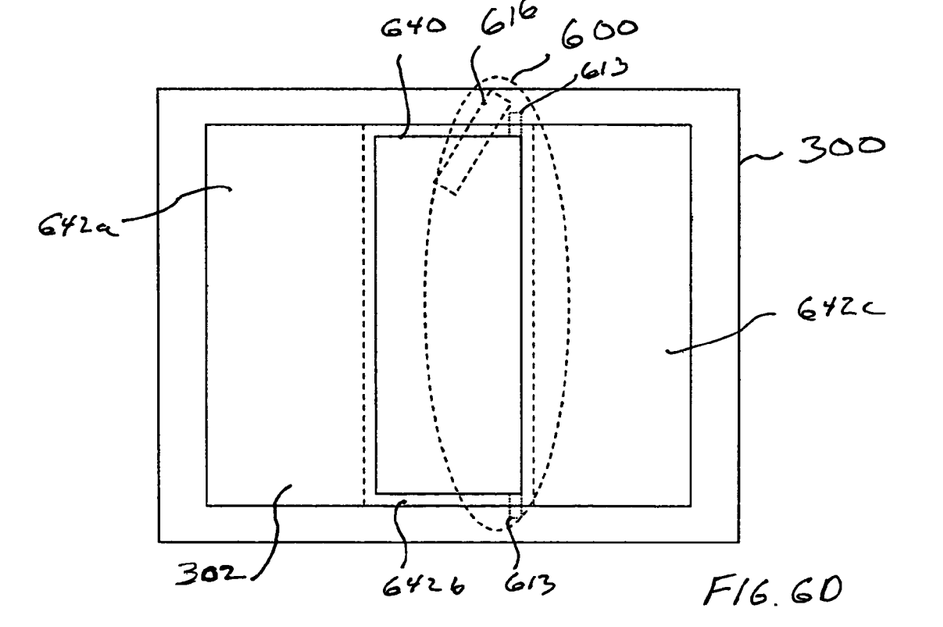
FIG. 6D is a perspective view of an alternative exemplary door and closure mechanism mounted within a module receiving area of a computer server housing in accordance with an aspect of the present invention.

FIG. 6D depicts an exemplary door 640 positioned within an opening 302 of a housing 300 where the opening 302 includes multiple module receiving areas (represented by three module receiving area 642a-c). The illustrated door 640 is dimensioned to cover at least a portion of one of the module receiving areas 609 (e.g., module receiving area 642b). The door 640 is illustrated with a pair of projections 613 that function as a transition apparatus for transitioning the door 640 between an open position and a closed position, and a resilient material strip 616 that functions as a resilient member for biasing the door 640 in the closed position.

The doors and closure mechanisms described above with reference to FIGS. 6A-6D are for illustrative purposes. Those of skill in the art will understand that one or more features shown and described with reference to one figure may be combined with one or more features shown and described with reference to one or more other figures. In addition, alternative doors and closure mechanisms will be understood by one of skill in the art from the description herein and are considered within the scope of the present invention.

FIG. 7 depicts a flow chart 700 of exemplary steps for use of a door positioned within a module receiving area of a computer server housing in accordance with various aspects of the present invention. The steps of flow chart 700 will be described with reference to FIGS. 2, 4, and 6A-D.

At block 702, a leading edge 400 of an IO module 100 is received on a front surface 212 of a door 210 associated with a module receiving area 209. The IO module 100 may be manually brought into contact with the door 210.

At block 704, electrostatic energy built-up in the IO module may optionally be discharged. As discussed above, at least a portion of the IO module 100, the door 210, and/or the closure mechanism 600 for the door 210 may be conductive. The conductive portions of the IO module 100, the door 210, and the closure mechanism 600 create electrostatic discharge paths 618 to discharge electrostatic energy built-up in the IO module 100 into the housing 202 via the door 210 and/or the closure mechanism 600. Once the leading edge 400 of the IO module 100 is received by the front surface 212 of the door 210, the electrostatic discharge paths 618 are created, allowing built-up electrostatic energy in the IO module 100 to discharge into the housing 202.

At block 706, the door 210 transitions from the closed position to the open position. In an exemplary embodiment, the door is biased in its closed position, e.g., by a resilient member. As the IO module 100 is inserted into the module receiving area 209 an insertion force associated with the IO module 100, e.g., manually applied along an insertion axis, $I_A$, overcomes the bias that maintains the door 210 in its closed positions and the door 210 begins to transition from its closed position to its open position. As the IO module 100 is inserted farther into the housing 202 through the module receiving area 609, a side surface 402 of the IO module 100 provides the force necessary to overcome the bias, which maintains the door 210 in the open position.

At block 708, contact between the IO module 100 and the door 210 is maintained with the door 210 in its open position while the IO module 100 is within the housing 202. While the IO module 100 is within the housing 202, the side surface 402 of the IO module 100 maintains contact with a free side 617 of the door 210/610 and/or the rotation side 615 of the door 210/610 (or, if present, the lip 624 of the door 210/610 on the free side 626 or rotation side 627). By maintaining contact with the door 210, the IO module 100 is able to supply the force needed to overcome the bias of the door 210 toward the closed position to maintain the door 210 in its open position. In addition, the contact between the door 210 and the IO module 100 inhibits EMI leakage along the side of the IO module 100 that is in contact with the door 210 (or the lip 624 of the door 210/610).

At block 710, the door 210 transitions from the open position to the closed position. As the IO module 100 is removed from the module receiving area 209, the insertion force associated with the door 210, e.g., applied along an insertion axis, $I_A$, is reduced/removed to allow the bias that maintains the door 210 in its closed positions to close the door 210 to transition the door 210 from its open position to its closed position. When the door 210 is in its closed position, the door 210 inhibits EMI leakage from the module receiving area 209 of the housing 202.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A computer server configured to receive one or more input/output (IO) modules, the computer server comprising:
a housing having an opening including a module receiving area arranged and configured to receive an IO module;
a first door having an open position and a closed position, the first door dimensioned to cover at least a portion of the module receiving area when in the closed position;
a second door having an open position and a closed position, the second door dimensioned to cover at least a portion of the module receiving area not covered by the first door and the second door when the first door and the second door are both in the closed position;
a first closure mechanism coupled to the first door and to the housing that positions the first door relative to the receiving area and permits the first door to transition between the open position and the closed position, the first closure mechanism biasing the first door toward the closed position; and
a second closure mechanism coupled to the second door and to the housing that positions the first door relative to the module receiving area and permits the second door to transition between the open position and the closed position, the second closure mechanism biasing the second door toward the closed position;
wherein the first closure mechanism enables the first door and the housing that positions the first door relative to the module receiving area and to transition from the open position to the closed position when the IO module is removed from the module receiving area;
the second closure mechanism enables the second door and the housing that positions the second door relative to the module receiving area and to transition from the open position to the closed position when the IO module is removed from the module receiving area; and
the first door and the second door have a front surface and a back surface, the back surface opposite the front surface, and at least a portion of the front surface of the first door and the front surface of the second door contact the IO module when the IO module is within the module receiving area and the first door and the second door are in their respective open positions to provide electromagnetic interference (EFI) shielding.

2. The computer server of claim 1, wherein each of the first door and the second door include a rotation side adjacent an axis of rotation about which the first door and the second door rotate between the open position and the closed position and a free side opposite the rotation side and wherein at least one of (a) the front side on the free side or (b) the front surface on the rotation side contacts the IO module when the IO module is within the module receiving area.

3. The computer server of claim 2, wherein each of the first door and the second door includes a lip extending around at least a portion of a perimeter on the front surface that contacts the IO module when the IO module is within the module receiving area.

4. The computer server of claim 1, wherein the door includes:
a plurality of holes extending through the first door, wherein the plurality of holes provide ventilation for the computer server.

5. The computer server of claim 1, wherein at least a portion of the first door is an electrical conductor.

6. The computer server of claim 1, wherein the housing has an interior surface and an exterior surface, the first door has a front surface and a back surface opposite the front surface, the first door is larger than the module receiving area, and the first closure mechanism positions the first door with respect to the housing such that at least a portion of the front surface of the first door is adjacent the interior surface of the housing when in the closed position.

7. The computer server of claim 1, wherein the first door has a front surface and a back surface opposite the front surface, the computer server further comprising:
an electrostatic discharge path extending from the front surface of the front door to the housing, wherein electrostatic energy built up in the IO module is discharged through the housing via the door when the IO module contacts the front surface of the first door upon insertion of the IO module into the module receiving area.

8. The computer server of claim 1, wherein the first door provides electromagnet interference (EMI) shielding for the computer server at the module receiving area when the first door is in the closed position.

9. The computer server of claim 1, wherein the first door has a front surface and a back surface opposite the front surface and at least a portion of the front surface contacts the IO module when the IO module is within the module receiving area and the first door is in the open position to provide electromagnetic interference (EMI) shielding.

10. The computer server of claim 9, wherein the first door includes a rotation side adjacent an axis of rotation about which the first door rotates between the open position and the closed position and a free side opposite the rotation side and wherein at least one of (a) the front side on the free side or (b) the front surface on the rotation side contacts the IO module when the IO module is within the module receiving area.

11. The computer server of claim 10, wherein of the first door includes a lip extending around at least a portion of a perimeter on the front surface that contacts the IO module when the IO module is within the module receiving area.

12. The computer server of claim 1, wherein the first closure mechanism includes at least one hinge coupled to the first door and to the housing, the hinge being adjacent a first side of the first door, the hinge enabling the first door to rotate about an axis adjacent the first side of the first door between the open position and the closed position.

13. The computer server of claim 1, wherein the first closure mechanism further includes at least one spring that biases the first door into the closed position.

14. The computer server of claim 1, wherein the module receiving area is between four and six inches in length and three inches in width.

15. The computer server of claim 1, wherein the opening includes at least two module receiving areas and wherein each module receiving area includes at least one door.

16. The computer server of claim 1, wherein the IO module is a Peripheral Component Interface Express (PCIe) Module.

* * * * *